(12) United States Patent
Mosko

(10) Patent No.: US 11,140,128 B2
(45) Date of Patent: Oct. 5, 2021

(54) HIERARCHICAL GEOGRAPHIC NAMING ASSOCIATED TO A RECURSIVELY SUBDIVIDED GEOGRAPHIC GRID REFERENCING

(71) Applicant: Palo Alto Research Center Incorporated, Palo Alto, CA (US)

(72) Inventor: Marc E. Mosko, Santa Cruz, CA (US)

(73) Assignee: PALO ALTO RESEARCH CENTER INCORPORATED, Palo Alto, CA (US)

(*) Notice: Subject to any disclaimer, the term of this patent is extended or adjusted under 35 U.S.C. 154(b) by 90 days.

(21) Appl. No.: 16/153,581

(22) Filed: Oct. 5, 2018

(65) Prior Publication Data

US 2020/0112542 A1   Apr. 9, 2020

(51) Int. Cl.
| | | |
|---|---|---|
| *G06F 15/16* | (2006.01) |
| *H04L 29/12* | (2006.01) |
| *H04L 12/745* | (2013.01) |
| *H04L 29/08* | (2006.01) |
| *H03M 7/30* | (2006.01) |

(52) U.S. Cl.
CPC .......... *H04L 61/609* (2013.01); *H04L 45/748* (2013.01); *H04L 61/1511* (2013.01); *H04L 61/3015* (2013.01); *H04L 67/18* (2013.01); *H04L 67/32* (2013.01); *H03M 7/30* (2013.01)

(58) Field of Classification Search
CPC .. H04L 61/609; H04L 61/3015; H04L 45/748
USPC ....................................................... 709/245
See application file for complete search history.

(56) References Cited

U.S. PATENT DOCUMENTS

| | | | | | |
|---|---|---|---|---|---|
| 6,954,697 | B1* | 10/2005 | Smith | ................. | G01C 21/30 |
| | | | | | 701/533 |
| 7,801,897 | B2* | 9/2010 | Egnor | ................. | G06F 16/29 |
| | | | | | 707/741 |
| 2003/0060970 | A1* | 3/2003 | Edge | ................. | G01C 21/20 |
| | | | | | 701/520 |
| 2004/0139049 | A1* | 7/2004 | Hancock | .......... | H04L 29/12009 |
| 2005/0278378 | A1* | 12/2005 | Frank | ................. | G06F 16/38 |
| 2008/0010605 | A1* | 1/2008 | Frank | ................. | G06F 16/38 |
| | | | | | 715/765 |
| 2008/0065685 | A1* | 3/2008 | Frank | ................. | G06F 16/29 |
| 2008/0086464 | A1* | 4/2008 | Enga | ................. | G06F 16/29 |
| 2008/0183730 | A1* | 7/2008 | Enga | ................. | G06F 16/29 |
| 2009/0077100 | A1* | 3/2009 | Hancock | ............. | H04L 67/02 |
| 2010/0076968 | A1* | 3/2010 | Boyns | ................. | G06F 16/29 |
| | | | | | 707/732 |
| 2010/0306409 | A1* | 12/2010 | Jansen | ............... | H04L 61/609 |
| | | | | | 709/245 |

(Continued)

*Primary Examiner* — Hee Soo Kim
(74) *Attorney, Agent, or Firm* — Shun Yao; Park, Vaughan, Fleming & Dowler LLP.

(57) ABSTRACT

Embodiments described herein provide a system for facilitating hierarchical geographic naming. During operation, the system receives a service request comprising location information associated with a requesting device and determines a hierarchical name corresponding to the location information. The hierarchical name can include a plurality of name segments. A respective name segment of the plurality of name segments can correspond to a recursively subdivided grid of geographic grid referencing. The system then performs a recursive search using the hierarchical name for a service requested by the service request.

20 Claims, 12 Drawing Sheets

(56) References Cited

U.S. PATENT DOCUMENTS

| | | | |
|---|---|---|---|
| 2013/0246443 A1* | 9/2013 | Laurenzo | G09B 29/007 |
| | | | 707/749 |
| 2014/0269723 A1* | 9/2014 | Wang | H04L 45/54 |
| | | | 370/392 |
| 2015/0234873 A1* | 8/2015 | Laurenzo | G01C 21/20 |
| | | | 707/743 |
| 2016/0091319 A1* | 3/2016 | Bonnell | G01C 21/3476 |
| | | | 701/461 |
| 2017/0103088 A1* | 4/2017 | Tuukkanen | G01C 21/3667 |

* cited by examiner

HIERARCHICAL GEOGRAPHIC NAMING ASSOCIATED TO A RECURSIVELY SUBDIVIDED GEOGRAPHIC GRID REFERENCING

BACKGROUND

Field

This disclosure is generally related to the field of location-based service management. More specifically, this disclosure is related to a system and method for facilitating service locations by encoding geographic locations into hierarchical names.

Related Art

The proliferation of the Internet and e-commerce continues to drive the need for efficient service access. An enterprise or large corporation may facilitate services across multiple sites. In such a distributed service structure, a user device may wish to determine a service location near to a point of interest (e.g., a current location of a user). A conventional approach typically locates a service site using latitude and longitude. However, latitude and longitude do not provide hierarchical location information. As a result, finding a specific service close to a specific location requires explicit enumeration of distance between the point of interest and the locations of the service sites.

Geographic grid referencing can provide a hierarchical grid reference system that facilitates recursive geographic searching across multiple location levels. The Military Grid Reference System (MGRS) is one of several hierarchical grid reference systems and can be used to represent a location anywhere on Earth. In MGRS, a Grid Zone Designation (GZD) represents an approximately 8° by 6° zone and carries a unique designation. There are 1,197 GZDs in the world. Each GZD is arranged into 100 kilometer (km) by 100 km grid squares. Each GZD can be identified by a corresponding identifier. The GZD is then recursively subdivided into 10 km, 1 km, 100 meter (m), 10 m, and 1 m grids (or squares). These square indicate a location level within a GZD and are represented as the numerical locations within the GZD. MGRS uses these conventions to encode a location.

While MGRS brings many desirable features to location-based services, some issues remain unsolved in efficiently encoding geographic locations into hierarchical names that can be used for recursively searching a service.

SUMMARY

Embodiments described herein provide a system for facilitating hierarchical geographic naming. During operation, the system receives a service request comprising location information associated with a requesting device and determines a hierarchical name corresponding to the location information. The hierarchical name can include a plurality of name segments. A respective name segment of the plurality of name segments can correspond to a recursively subdivided grid of geographic grid referencing. The system then performs a recursive search using the hierarchical name for a service requested by the service request.

In a variation on this embodiment, the system encodes the geographic grid referencing into the hierarchical name as a bit- or byte-oriented string.

In a further variation, the system compresses the string using one of: arithmetic coding, Huffman coding, and a probability distribution.

In a variation on this embodiment, the geographic grid referencing is based on one of: Military Grid Reference System (MGRS) and Universal Transverse Mercator (UTM).

In a variation on this embodiment, the system performs a longest-prefix match based on the hierarchical name to forward a packet toward a service provider providing the service.

In a further variation, the system maintains a name resolution service (NRS) for geographic routing and obtains information associated with the service provider from the NRS.

In a variation on this embodiment, the recursive search is one of: (i) a reverse domain name system (DNS) lookup performed using the hierarchical name, and (ii) a database lookup performed using the hierarchical name.

In a variation on this embodiment, the system performs the recursive search by searching whether the requested service is available in the smallest grid indicated by the hierarchical name. If the requested service is not found in the smallest grid, the system removes the name segment corresponding to the smallest grid and performs the search based on the updated hierarchical name.

In a further variation, if the requested service is found in the smallest grid, the system retrieves service information associated with the requested service and sends a response comprising the service information to the requesting device.

In a variation on this embodiment, the system incorporates in the hierarchical name one or more of: a service tag indicating the requested service, a high-level domain, and a bit pattern distinguishing the hierarchical name from an identifier associated with the geographic grid referencing.

BRIEF DESCRIPTION OF THE FIGURES

In the figures, like reference numerals refer to the same figure elements.

DETAILED DESCRIPTION

Figure 1A:
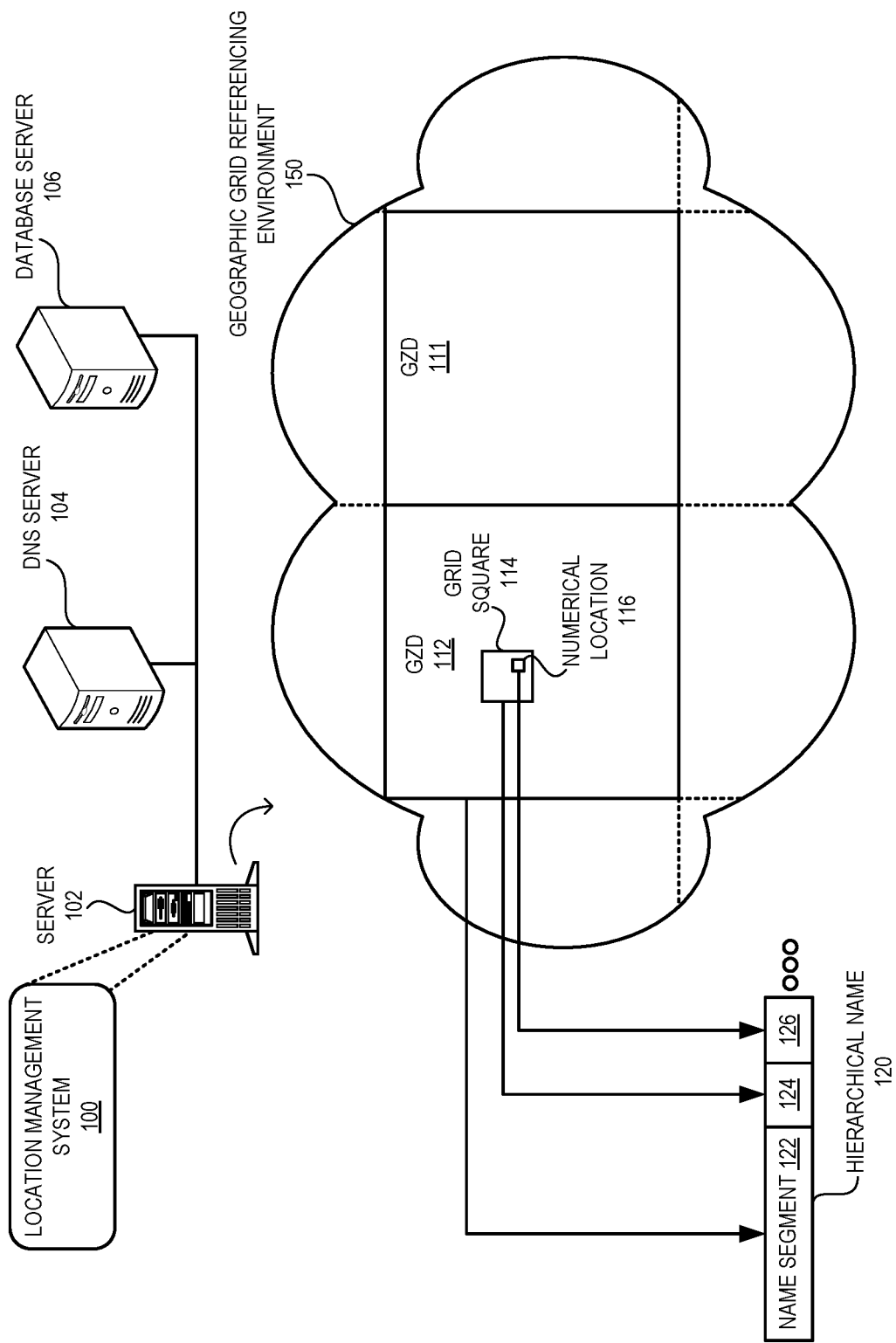
FIG. 1A illustrates an exemplary hierarchical naming based on geographic grid referencing, in accordance with an embodiment of the present application.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein solve the problem of efficiently resolving location-based queries for services by (i) generating hierarchical names that incorporate hierarchical location information associated with geographic grid referencing; and (ii) using hierarchical names for searching for services near a point of interest. This hierarchical naming system can facilitate large-scale routing and service lookup based on geo-coordinates because hierarchical naming can incorporate zonal information.

With existing technologies, some naming schemes use latitude and longitude to incorporate geographic information. However, latitude and longitude indicate a specific location and have a flat structure. As a result, latitude and longitude do not have a hierarchical structure and, hence, may not provide recursive searches. For example, latitude and longitude can be included in a domain name system (DNS) record. However, such location information may not be used for looking up records by location. To provide location-based information, all feasible names are looked up, and the respective distances between a point of interest (e.g., one's current location) and the looked-up location records are calculated. This leads to extensive calculations and inefficient record lookups for providing location-based searches.

To solve these problems, embodiments described herein provide a location management system that incorporates hierarchical location information associated with geographic grid referencing into hierarchical names. The system can include grid locations associated with geographic grid referencing in a service database or a DNS server. The system can use the hierarchical names to retrieve location information associated with hierarchical location levels of geographic grid referencing. For example, geographic grid referencing provides different levels of grids, such as 100 km, 10 km, 1 km, 100 m, 10 m, and 1 m grids. Each grid can be a square of the corresponding size. For example, a 10 km grid can be a 10 km square. These grids are hierarchical; the larger grids are recursively subdivided into the smaller grids.

The hierarchical name can include a number of name segments, each of which corresponds to a particular grid level of geographic grid referencing. As a result, the system can perform a recursive search from a larger grid to a smaller grid, or from a smaller grid to a larger grid by traversing the hierarchical names. For example, if a user wishes to find a specific service (e.g., a restaurant) nearby, the system can obtain the hierarchical name associated with the grid in which the user is located. The system then can search in a service database or the DNS records associated with the service based on the hierarchical name. If the system does not find one, the system can remove the name segment corresponding to the smallest grid (e.g., the 1 m grid) and perform a recursive search with the updated name in the next grid level (e.g., in the 10 m grid). The system can continue with the recursive search to find the service, thereby providing an efficient way to discover a service in an efficient way.

In some embodiments, the system uses MGRS for geographic grid referencing. In MGRS, each GZD is arranged into a 100 km grid, which is then recursively subdivided into 10 km, 1 km, 100 m, 10 m, and 1 m grids. MGRS uses these conventions to encode a location. The GZDs in polar regions are represented by 4 letters: A, B, Y, and Z. Outside of the polar regions, the GZDs are represented using a number between 1 and 60 followed by a letter between C and X (excluding I and O). Thus, there are 20×60+4=1,204 possible GZDs. Each GZD includes a 10 km square grid represented by a column letter (A-Z, omitting I and O) and a row letter (A-V, omitting I and O). So, there are at most 24×20=480 possible square grids in a GZD.

The numerical location within a square grid is identified by an n+n pair of numbers. The first number represents the easting (from the left edge of the square grid), and the second number represents the northing (from the bottom of the square grid). For example, a 5+5 numerical representation can locate a 1 m grid in the square grid. In the same way, a 4+4 numerical representation can locate a 10 m grid in the square grid. For example, San Francisco City Hall is located at 37.77919° N, −122.41914° W, which is the equivalent of 10S EG 51150 81474 in MGRS coordinates. Here, "10S" represents the GZD, "EG" represents a square grid within the GZD, "51150" represents the easting, and "81474" represents the northing. The system can also use a similar civilian grid system, Universal Transverse Mercator (UTM). The coordinates of San Francisco City Hall in UTM are 10N 551151 4181475.

Exemplary System and Encoding

FIG. 1A illustrates an exemplary hierarchical naming based on geographic grid referencing, in accordance with an embodiment of the present application. In this example, a location management system 100 can facilitate location-based services, such as service lookup and geographic routing based on locations. System 100 can run on a server 102, which can be a physical or a virtual device. With existing technologies, system 100 can use latitude and longitude to incorporate geographic information. However, latitude and longitude indicate a specific location and have a flat structure. Since latitude and longitude do not have a hierarchical structure, system 100 cannot use them to perform recursive searches to facilitate a location-based service.

For example, system 100 may incorporate latitude and longitude in a DNS record. However, system 100 may not use such location information for looking up records by location. To provide location-based information, system 100 looks up all feasible names. System 100 then calculates the respective distances between a point of interest (e.g., one's current location) and the looked-up location records. This leads to extensive calculations and inefficient record lookups for providing location-based services. Therefore, system 100 may not be able perform efficiently using latitude and longitude.

To solve these problems, embodiments described herein allow system 100 to incorporate hierarchical location information associated with a geographic grid referencing environment 150 into hierarchical names. System 100 then uses the hierarchical names to facilitate location-based services. Examples of grid referencing environment 150 include MGRS and UTM. If environment 150 is based on MGRS, environment 150 can cover the entire Earth. On the other hand, if environment 150 is based on UTM, environment 150 can exclude the polar regions of the Earth. In this example, environment 150 is based on MGRS, and includes a number of GZDs, such as GZDs 111 and 112.

System 100 can include grid locations associated with environment 150 in a DNS record on a DNS server 104 or in a service database on a database server 106. System 100 can use a hierarchical name, such as name 120, to retrieve location information associated with hierarchical location levels of geographic grid referencing in environment 150. For example, geographic grid referencing provides different levels of grids, such as 100 km, 10 km, 1 km, 100 m, 10 m, and 1 m grids, within environment 150. These grids are hierarchical: the larger grids are recursively subdivided into the smaller grids. For example, GZD 112 can indicate a 100 km grid (or a 100 km square) in environment 150. Within GZD 112, a grid square 114 indicates a 10 km grid. Therefore, GZD 112 can include 100 grid squares. It should be noted that the grids shown in the figures of this disclosure are not to scale.

Name 120 can include a number of name segments 122, 124, and 126. Each of these name segments corresponds to a particular grid level of geographic grid referencing in environment 150. In this example, name segments 122, 124, and 126 can correspond to GZD 112, grid square 114, and a numerical location 116 within grid square 114, respectively. As a result, system 100 can perform a recursive search from a larger grid to a smaller grid, or from a smaller grid to a larger grid in environment 150 by traversing the name segments of name 120. To perform the recursive search, system 100 can concatenate a subset of consecutive name segments, and can perform the recursive search.

Suppose that a user is located near location 116. If the user wishes to find a specific service (e.g., a restaurant) nearby, system 100 can obtain name 120, which is associated with the grid in which the user is located. System 100 then can search a service database in database server 106 or the DNS records in DNS server 104 for the service based on name 120. If system 100 does not find the service, system 100 can remove name segment 126 and perform a recursive search with the updated name with name segments 122 and 124. In this example, this iteration of the recursive search performs the search operation in grid square 114. System 100 can continue with the recursive search until the service is found. In this way, hierarchical naming based on geographic grid referencing provides an efficient way to discover a service in environment 150.

Figure 1B:
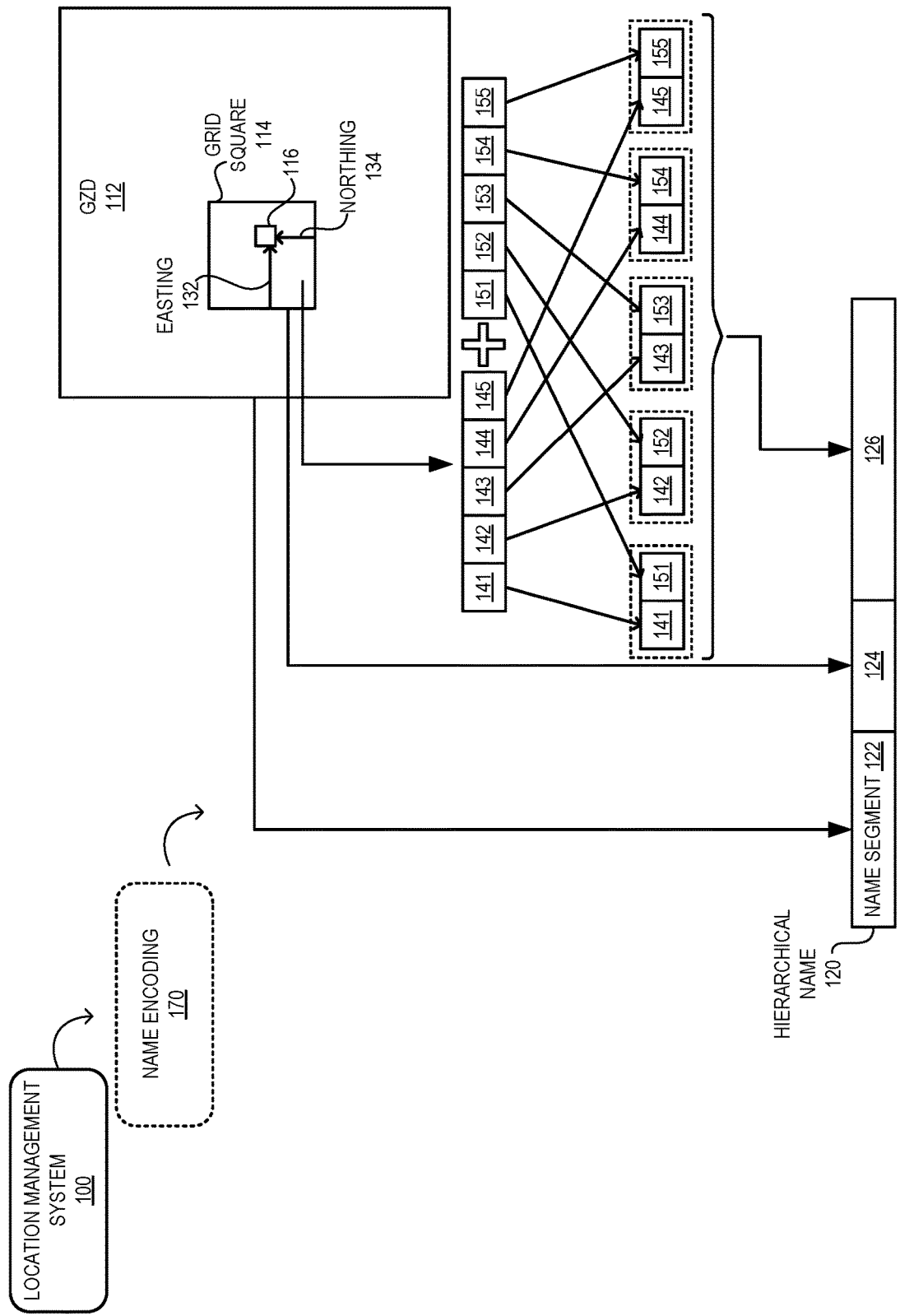
FIG. 1B illustrates an exemplary encoding of a hierarchical name, in accordance with an embodiment of the present application.

FIG. 1B illustrates an exemplary encoding of a hierarchical name, in accordance with an embodiment of the present application. System 100 can encode an MGRS coordinate based on a name encoding 170 to generate hierarchical name 120. Geographic grid referencing can indicate location 116 in grid square 114 of GZD 112 based on easting 132 and northing 134. In name encoding 170, the first name segment 122 can correspond to GZD 112, the next name segment 124 can correspond to grid square 114, and the next name segment 126 can correspond to easting 132 and northing 134. Name segment 126 can include a number of segments, one for each resolution of the numerical location with a numeric indicator of easting 132 and a numeric indicator of northing 134 concatenated.

Suppose that $e\_i$ is the ith digit of easting 132 and $n\_i$ is the ith digit of northing 134. Name segment 126 can then be /$e\_1$∥$n\_1$/$e\_2$∥$n\_2$/ . . . /$e\_5$∥$n\_5$. For example, if the digits of easting 132 are 141, 142, 143, 144, and 145, and the digits of northing 134 are 151, 152, 153, 154, and 155, name segment 126 can then be /141.151/142.152/143.153/144.154/145.155/. Here, "." represents a concatenation. Based on name encoding 170, MGRS coordinate 10S EG 51150 81474 can be encoded as a hierarchical name as /10S/EG/58/11/14/57/04. This name encoding 170 can also be applicable to type-length-value (TLV)-delimited strings (e.g., delimited using a ";").

Name encoding 170 can be based on a fixed-length, byte-oriented string, which can use 2 bytes for name segment 122, 2 bytes for name segment 124 square, and 1 byte for each resolution of easting/northing in name segment 126. For example, name encoding 170 can use 1 byte for each of 141.151, 142.152, 143.153, 144.154, and 145.155. For an easting/northing with five digits each, the encoding results in a 9-byte string. In other words, hierarchical name 120 can be encoded in a 9-byte string. System 100 can use a function ord( ) that returns an ASCII value of a letter (e.g., as available in a programming language library) to encode the GZD identifier into name segment 122. Suppose that name segment 122 corresponding to a GZD can be encoded by (N−1)×26+(ord(L)−ord('A')). Here, N can be the number 61 and L can be the letter A, B, X, or Y for the polar regions. Otherwise, N can be the number between 1 and 60 and L can be a letter C-X (excluding I and O) in the GZD identifier. It should be noted that this may not be a compact representation because encoding corresponding to letters I and O can remain empty and encoding associated with A, B, X, and Y only exists for number 61.

A grid square is represented by a column letter (A-Z, except I and O) and a row letter (A-V, except I and O). Name segment 124 corresponding to a grid square (i.e., the 100 km grid) can be encoded with a compact representation by moving 'U' to 'I,' 'V' to 'O,' 'Y' to 'U,' and 'Z' to 'V.' This allows name encoding 170 to represent name segment 124 using a possible 20 values for the row letter and 24 values for the column letter. If the column letter is CL and the row letter is RL, name segment 124 can be encoded as xfrm (CL)×24+xfrm(RL). Here, xfrm( ) can be an encoding function of name encoding 170 that compacts the column and row representation. If C represents CL or RL, xfrm(C) can be defined as:

ord('T')−ord('A'), if C='U;'
ord('O')−ord('A'), if C='V;'
ord('U')−ord('A'), if C='Y;'
ord('V')−ord('A'), if C='Z;' and
ord(C)−ord('A'), otherwise.

In addition, numerical location 116 is represented by a base-10 number of easting 132 concatenated with a base-10 number of northing 134. Therefore, the resultant number can be between 00 and 99. Each such element is encoded as a number in one byte. For a 5+5 representation of numerical location 116, name segment 126 can be encoded with 5 bytes, each as a decimal number. Hence, if hierarchical name 120 is /10S/EG/58/11/14/57/04, system 100 can use name encoding 170 to encode hierarchical name 120 as 00FC: 0066:3A:0B:0E:39:04.

To generate fixed-length, bit-oriented string, name encoding 170 can use 11 bits for name segment 122, 9 bits for name segment 124, and 7 bits for each easting/northing resolution in name segment 126. This encoding uses the same numerical values as in the fixed-length, byte-oriented encoding. However, this encoding can only use the minimum number of bits required for each name segment. While name encoding 170 may use fewer bits to encode some specific GZDs, name encoding 170 can prefer fixed-length bit fields to ensure efficient hardware lookup. Hence, if hierarchical name 120 is /10S/EG/58/11/14/57/04, system 100 can use name encoding 170 to encode hierarchical name 120 as 00011111100:001100110:0111010:0001011: 0001110:0111001:0000100.

Another option for name encoding 170 is to represent all 574,560 GZD combinations as a single field. Such a representation would use 20 bits; since the bit-oriented representation also uses 20 bits, there is no savings. In the byte-oriented representation, name encoding 170 could save a single byte. Therefore, name encoding 170 may not change the hierarchical representation for such a small savings. In a bit-oriented representation, name encoding 170 may also use compression techniques, such as arithmetic or Huffman coding, and probability distributions, such as population density or cell phone density. Because such an encoding needs global coordination for the dictionaries, name encoding 170 may include a prefix that identifies the dictionary version being used.

Figure 2:
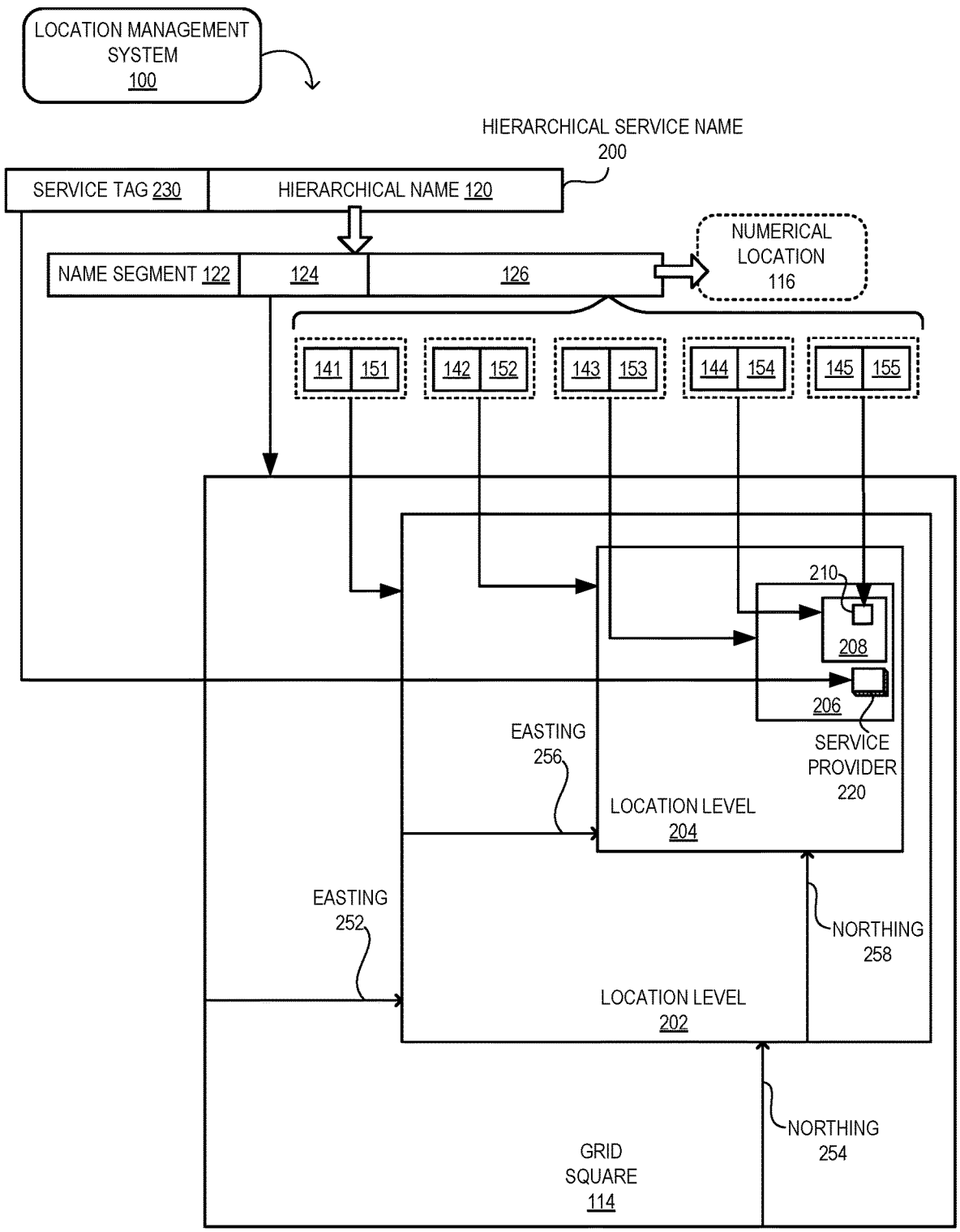
FIG. 2 illustrates an exemplary hierarchical service name that incorporates a service tag into a hierarchical name, in accordance with an embodiment of the present application.

FIG. 2 illustrates an exemplary hierarchical service name that incorporates a service tag into a hierarchical name, in accordance with an embodiment of the present application. In one way to deliver location-based services, system 100 can attach a service tag 230 as a prefix to hierarchical name 120. For example, service tag 230 can be 0x2345678 for a restaurant location service. System 100 can also prepend a bit string 0B1100 to service tag 230 to differentiate it from other encodings. In this way, system 100 generates a hierarchical service name 200 by tagging hierarchical name 120 with service tag 230. Hence, if hierarchical name 120 is /10S/EG/58/11/14/57/04, hierarchical service name 200 can be C234567:00FC:0066:3A:0B:0E:39:04.

In this example, numerical location 116 is represented by name segment 126, which can correspond to location levels 202, 204, 206, 208, and 210. If name segment 126 is /141.151/142.152/143.153/144.154/145.155/, location levels 202, 204, 206, 208, and 210 are represented by easting/northing values 141.151, 142.152, 143.153, 144.154, and 145.155, respectively. For example, location level 202 can be represented by easting/northing values 141.151. Here, easting value 141 can correspond to easting 252 and northing value 151 can correspond to northing 254. Similarly, location level 204 can be represented by easting/northing values 142.152. Here, easting value 142 can correspond to easting 256 and northing value 152 can correspond to northing 258.

If service tag 230 corresponds to a restaurant, hierarchical service name 200 can include hierarchical name 120, which can be used to find the nearest restaurant service provider. Suppose that a user is located in location level 210 and issues a search based on hierarchical service name 200. System 100 first searches in location level 210, which is represented by 145.155 in name segment 126. If the search does not find a restaurant service provider, system 100 removes 145.155 from name segment 126. System 100 then recursively searches in next location level 208, which is represented by 144.154 in name segment 126. If the search finds a restaurant service provider 220 corresponding to service tag 230, system 100 can return that information to the user.

Hierarchical-Name-Based Services

Figure 3A:
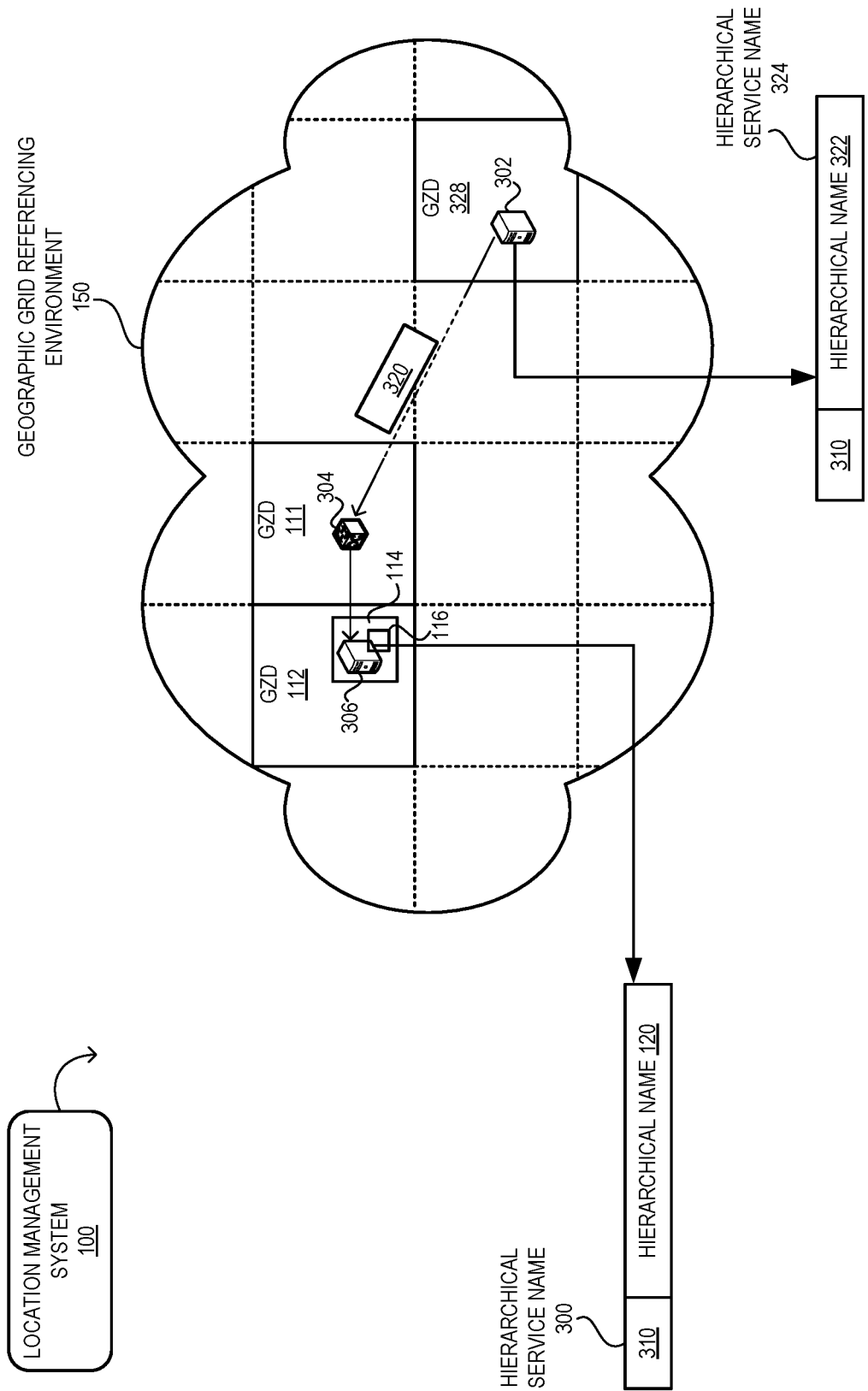
FIG. 3A illustrates an exemplary geographic routing based on hierarchical names, in accordance with an embodiment of the present application.

FIG. 3A illustrates an exemplary geographic routing based on hierarchical names, in accordance with an embodiment of the present application. Suppose that a service provider 306 provides a particular service corresponding to a service tag 310. If service provider 306 resides in numerical location 116 in square grid 114 of GZD 112, service provider 306 can advertise its location and the service it provides by advertising a hierarchical service name 300. Hierarchical service name 300 can include service tag 310 indicating the provided service and hierarchical name 120 indicating the location of the service. This advertisement can be obtained by forwarding device 304 (e.g., a network switch or a router) in GZD 111. Forwarding device 304 can forward any request for this service toward service provider 306.

If a requesting device 302 in GZD 328 intends to access the service associated with service tag 310, requesting device 302 can send a packet 320 based on a hierarchical service name 324, which can include service tag 310 and a hierarchical name 322 corresponding to the location of requesting device 302. Upon receiving packet 320, forwarding device 304 can determine that packet 320 is requesting a service provided by service provider 306 based on service tag 310. Forwarding device 304 can use a longest-prefix-match using hierarchical name 120 to find the nearest service provider that provides the service associated with service tag 310. Forwarding device 304 can then forward packet 320 to service provider 306 based on hierarchical name 120. In the same way, any response to packet 320 is forwarded back to requesting device 302 based on hierarchical name 322.

Because the number of services may be large and the available high-speed memory in forwarding device 304 can be limited, a name resolution service (NRS) can be deployed for geographic routing. For example, there may be a NRS. The corresponding NRS service can be associated with a service tag (e.g., a tag of 0x00000001). This can be the only service advertised for facilitating geographic routing. Other services, such as the service associated with service tag 310, can be looked up in the nearest server hosting the NRS. For example, service provider 306 can register the service associated with service tag 310 with a nearby server hosting the NRS, which propagates the registration up the geo-location hierarchy. The registration (and corresponding de-registration) could operate similarly to the dynamic DNS service.

Figure 3B:
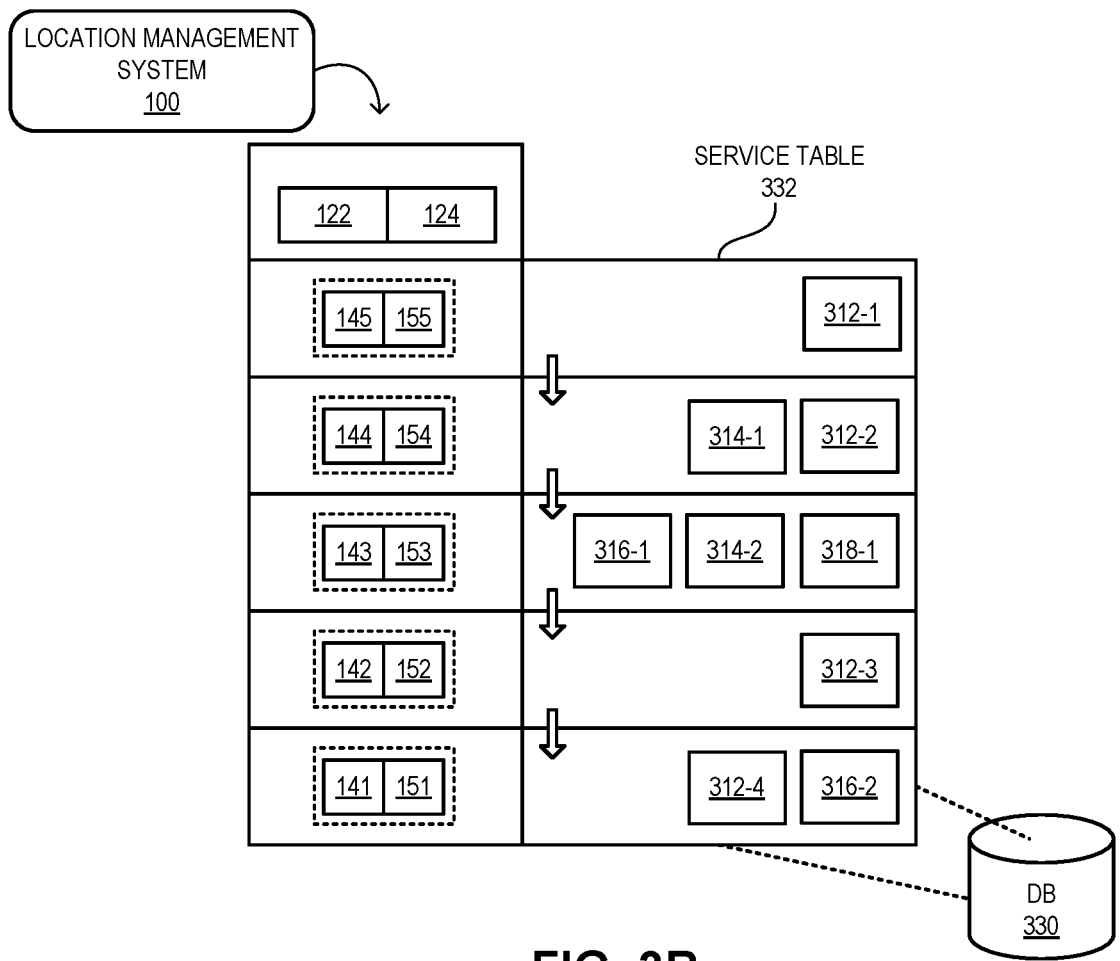
FIG. 3B illustrates an exemplary service table that maps services to different location levels of a hierarchical name, in accordance with an embodiment of the present application.

FIG. 3B illustrates an exemplary service table that maps services to different location levels of a hierarchical name, in accordance with an embodiment of the present application. In this example, system 100 can maintain a service database 330, which can include a service table 332. This table 332 can maintain a respective service instance provided at a specific service location. In this example, table 332 includes records for services 312, 314, 316, and 318. The location level corresponding to easting/northing values 145.155 can include service instance 312-1. For example, if service 312 indicates a restaurant chain, service instance 312-1 can be a particular branch of that restaurant.

Similarly, the location level corresponding to easting/northing values 144.154 can include service instances 312-2 and 314-1. Since the grid indicated by easting/northing values 144.154 includes the grid indicated by easting/northing values 145.155, table 332 can indicate that service instance 312-1 is also available in the location level corresponding to easting/northing values 144.154 (denoted with an arrow). The location level corresponding to easting/northing values 143.153 can include service instances 316-1, 314-2, and 318-1. The location level corresponding to easting/northing values 142.152 can include service instance 312-3. The location level corresponding to easting/northing values 141.151 can include service instances 312-4 and 316-2.

Figure 3C:
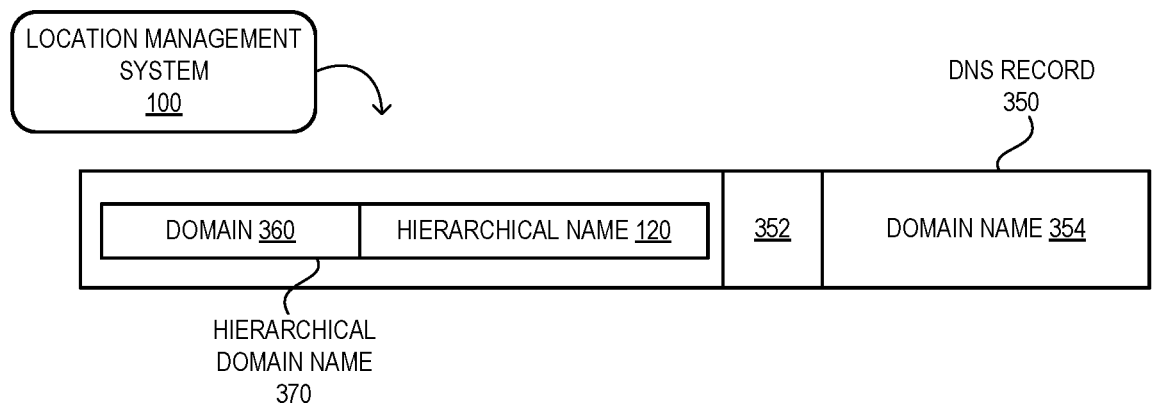
FIG. 3C illustrates an exemplary name resolution entry corresponding to a hierarchical name, in accordance with an embodiment of the present application.

FIG. 3C illustrates an exemplary name resolution entry corresponding to a hierarchical name, in accordance with an embodiment of the present application. System 100 can incorporate hierarchical names in DNS records in such a way that a domain name can be looked up using the hierarchical name. This can operate similarly to how reverse Internet Protocol (IP) address lookups work. Reverse location lookups using hierarchical names can operate under a top-level domain (TLD) (e.g., mgrs.loc). System 100 can encode location information and service tags in that TLD in a reverse way (e.g., hierarchical name-to-domain-name mapping). It should be noted that a coordinating agency for each grid square may handle the updates under that grid square.

A single service provider, such as service provider 306 in the example in FIG. 3A, could use this system in the DNS server corresponding to GZD 112. If service provider 306 is associated with a top-level domain 360, the DNS server can maintain a DNS record 350, which maps top-level domain 360 and its location information indicated by hierarchical name 120 to a corresponding domain name 354. The combination of domain 360 and hierarchical name 120 can be referred to as a hierarchical domain name 370. DNS record 350 can also include a record type 352. For example, using com.example domain, system 100 may encode service location 10S.EG.74.70.74.90.51 to a corresponding domain name xyz.net. DNS record 350 can then be:

com.example.10S.EG.74.70.74.90.51 TXT zyz.net.

Here, "com.example.10S.EG.74.70.74.90.51" can be hierarchical domain name 370. DNS record 350 enables a DNS client to query for its current location and then resolve, step by step, the service near its location by walking the DNS tree.

Operations

Figure 4A:
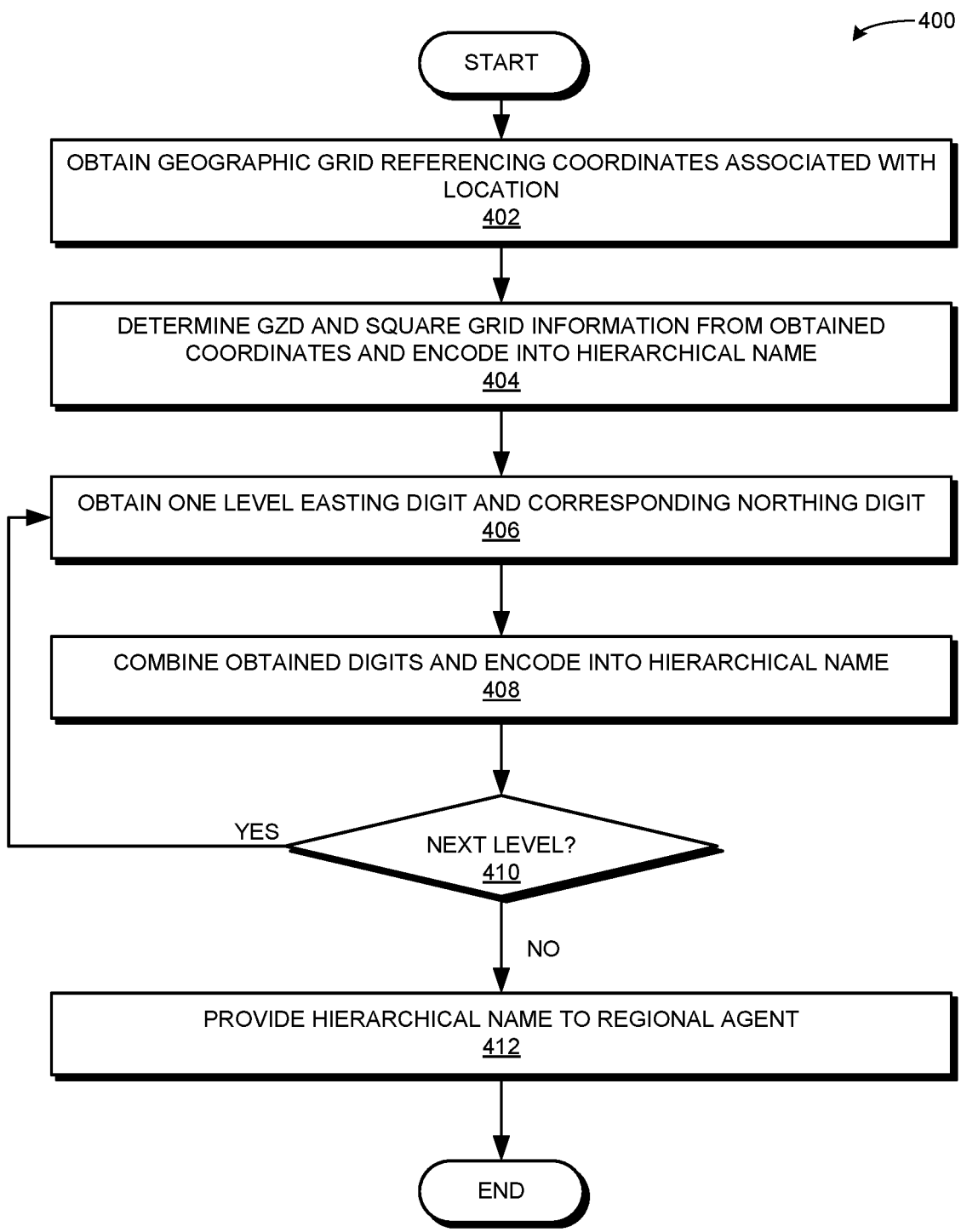
FIG. 4A presents a flowchart illustrating a method of generating a hierarchical name based on geographic grid referencing, in accordance with an embodiment of the present application.

FIG. 4A presents a flowchart 400 illustrating a method of generating a hierarchical name based on geographic grid referencing, in accordance with an embodiment of the present application. During operation, a location management system obtains geographic grid referencing coordinates associated with a location (operation 402). The system determines the GZD and square grid information from the obtained coordinates and encodes the information into hierarchical name (operation 404). The system also obtains one level easting digit and the corresponding northing digit (operation 406), and combines the obtained digits and encodes the combined digits into the hierarchical name (operation 408). The system then checks whether a next level location is there for the geographic grid referencing (operation 410). If there is a next level, the system continues to obtain one level easting digit and the corresponding northing digit (operation 406). Otherwise, the system provides the hierarchical name to the regional agent (e.g., a regional DNS server) (operation 412).

Figure 4B:
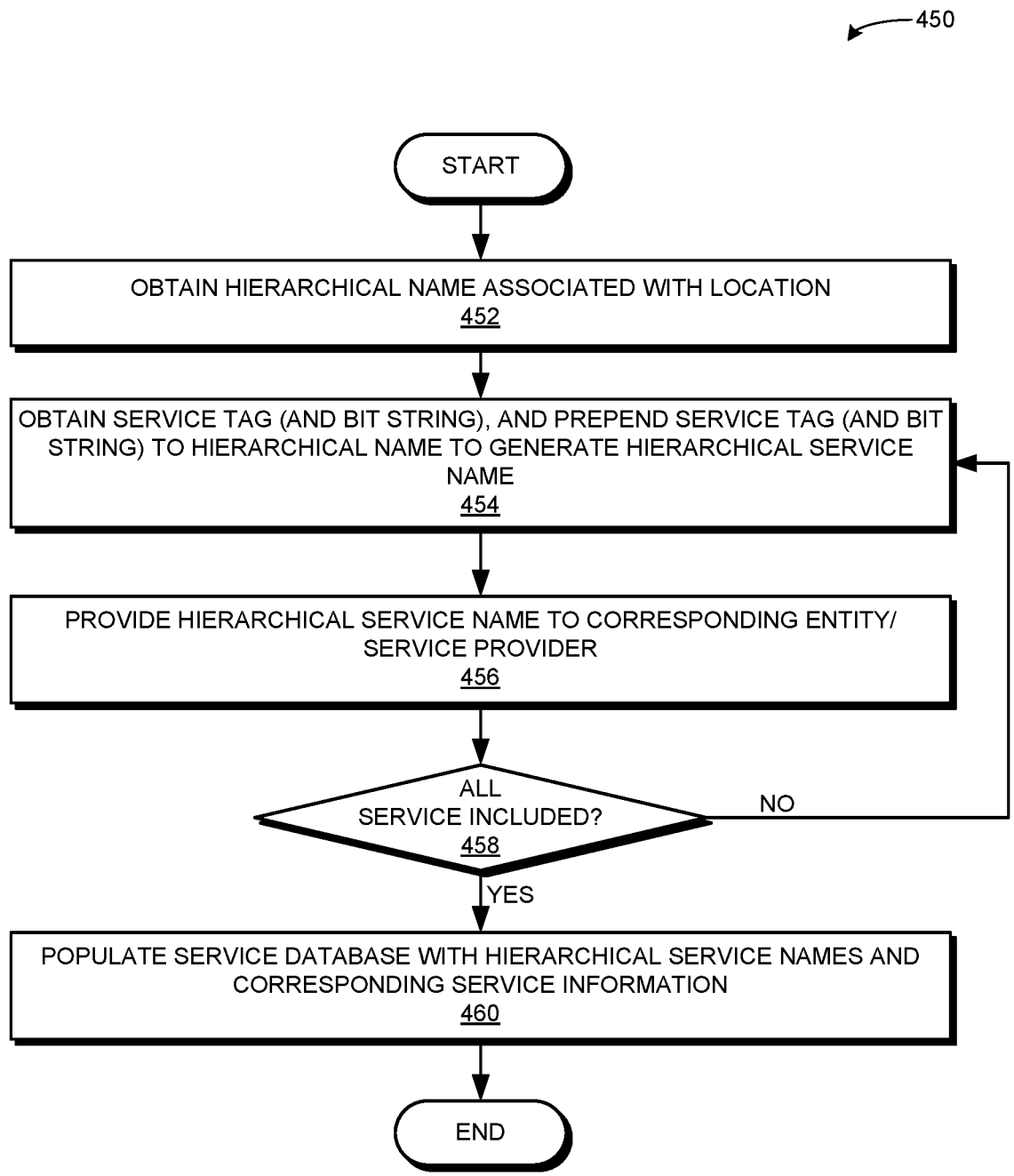
FIG. 4B presents a flowchart illustrating a method of incorporating information of services provided in a geographic grid into a hierarchical name, in accordance with an embodiment of the present application.

FIG. 4B presents a flowchart 450 illustrating a method of incorporating information of services provided in a geographic grid into a hierarchical name, in accordance with an embodiment of the present application. During operation, a location management system obtains a hierarchical name associated with a location (operation 452), and obtains a service tag (and a bit string) and prepends the service tag (and the bit string) to the hierarchical name to generate a hierarchical service name (operation 454). The system can provide the hierarchical service name to the corresponding entity/service provider (operation 456). The system then checks whether all service at the location has been included (operation 458). If not, the system obtains another service tag (and bit string), and prepends the service tag (and the bit string) to the hierarchical name to generate another hierarchical service name (operation 454). Otherwise, the system populates a service database with the hierarchical service names and corresponding service information (operation 460).

Figure 5:
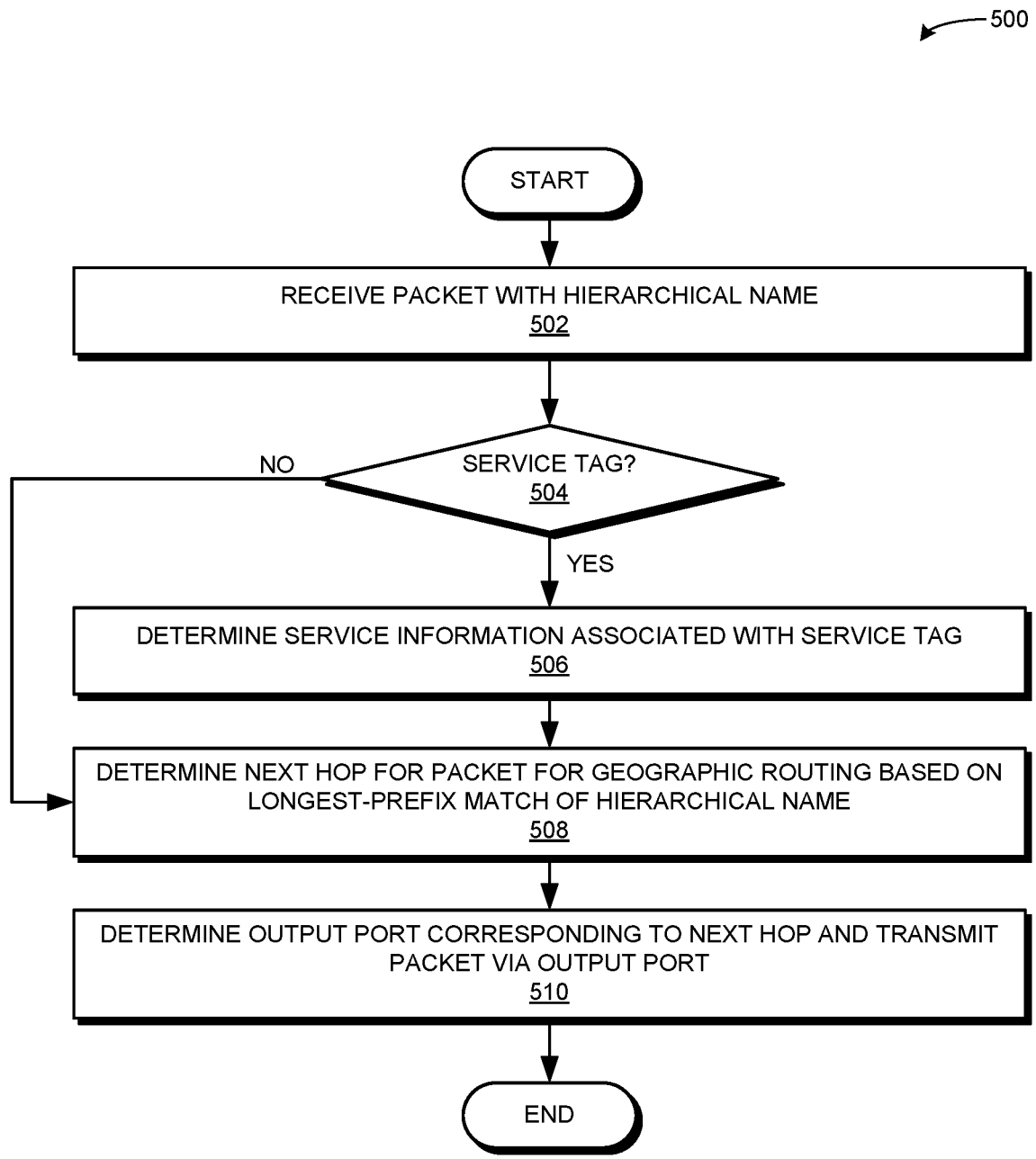
FIG. 5 presents a flowchart illustrating a method of facilitating geographic routing based on hierarchical names, in accordance with an embodiment of the present application.

FIG. 5 presents a flowchart 500 illustrating a method of facilitating geographic routing based on hierarchical names, in accordance with an embodiment of the present application. During operation, a forwarding device receives a packet with a hierarchical name (operation 502) and checks for a service tag (operation 504). Upon detecting a service tag, the device determines service information associated with the service tag (operation 506). If there is no service tag (operation 504) or the service information has been obtained (operation 506), the device determines the next hop for the packet for geographic routing based on a longest-prefix match of the hierarchical name (operation 508). The device then determines an output port corresponding to the next hop and transmits the packet via the output port (operation 510).

Figure 6A:
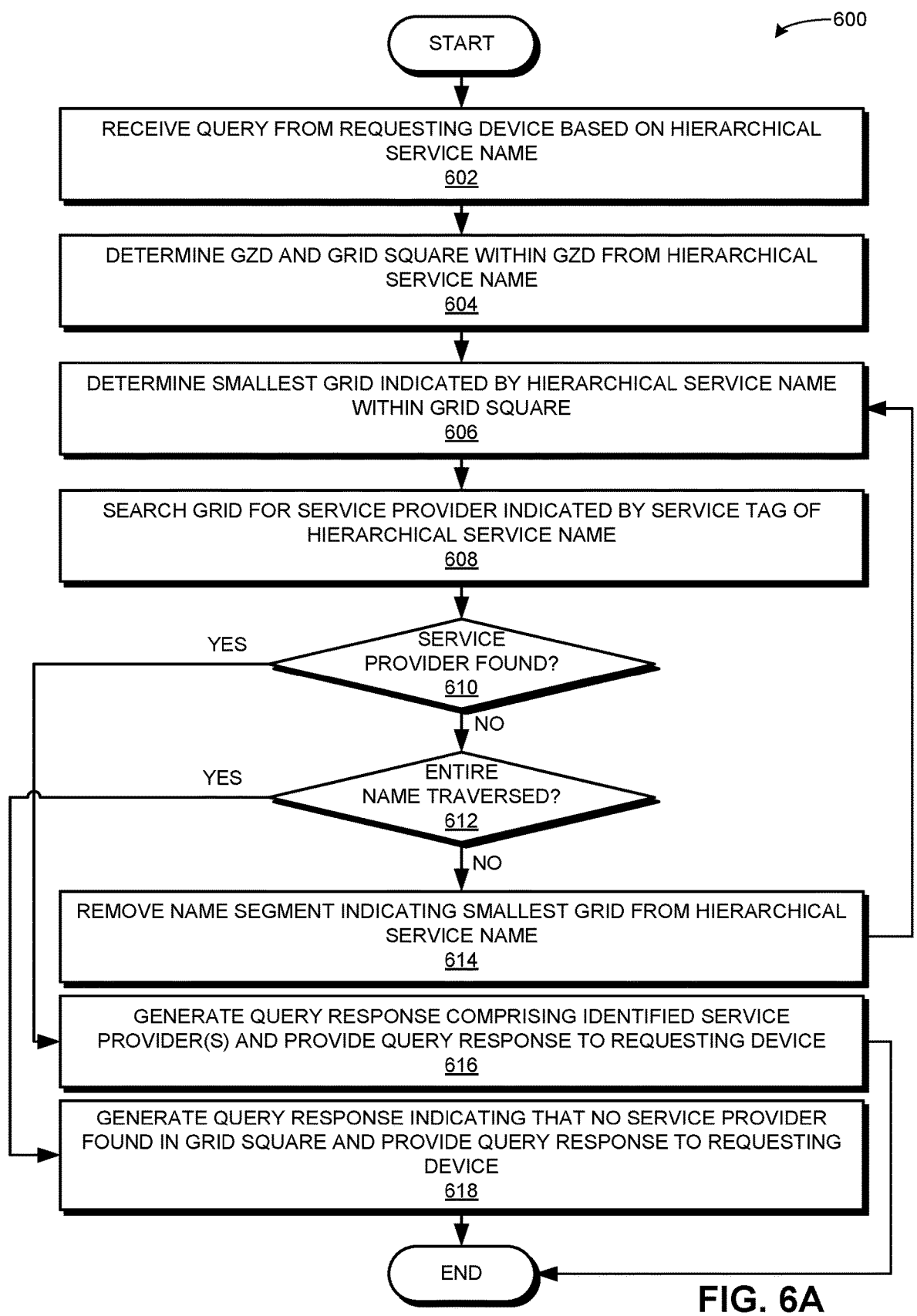
FIG. 6A presents a flowchart illustrating a method of recursively searching for a service based on a hierarchical name, in accordance with an embodiment of the present application.

FIG. 6A presents a flowchart 600 illustrating a method of recursively searching for a service based on a hierarchical name, in accordance with an embodiment of the present application. During operation, a location management system receives a query from a requesting device based on a hierarchical service name (operation 602). The system determines the GZD and the grid square from the hierarchical service name (operation 604) and the smallest grid indicated by the hierarchical service name within the grid square (operation 606). The system then searches the grid for a service provider indicated by the service tag of the hierarchical service name (operation 608). The system then checks whether a service provider has been found (operation 610).

If a service provider is not found, the system can also check whether the entire hierarchical name portion of the hierarchical service name has been traversed (operation 612). If the entire hierarchical name has not been traversed, the system removes the name segment indicating the smallest grid from the hierarchical service name (operation 614) and determines the smallest grid indicated by the updated hierarchical service name within the grid square (operation 606). If a service provider has been found (operation 610), the system generates a query response comprising the identified service provider(s) and provides the query response to the requesting device (operation 616). On the other hand, if a service provider has not been found and the entire name has been traversed (operations 610 and 612), the system generates a query response indicating that no service provider has been found and provides the query response to the requesting device (operation 618).

Figure 6B:
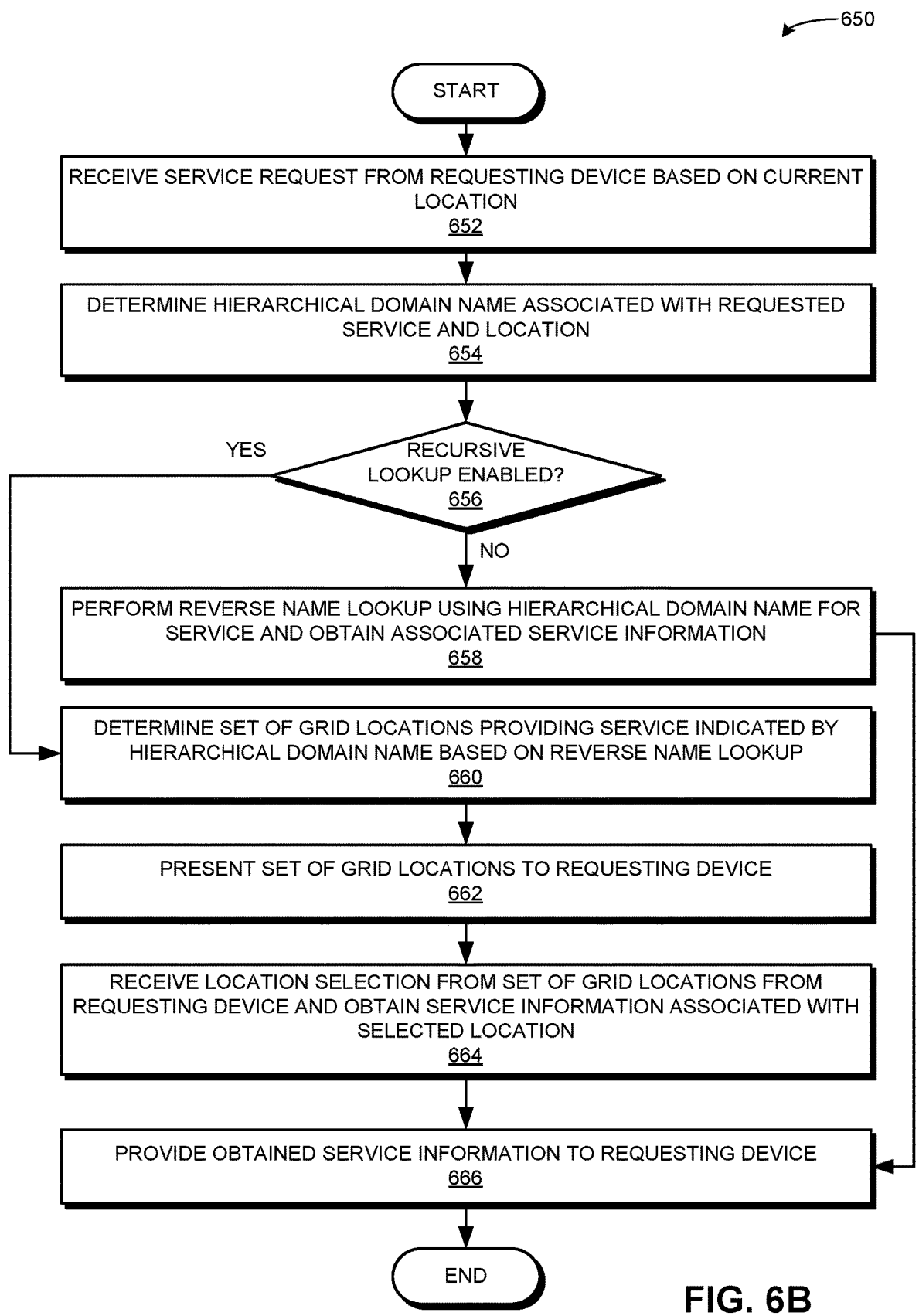
FIG. 6B presents a flowchart illustrating a method of a name resolution based on a hierarchical name, in accordance with an embodiment of the present application.

FIG. 6B presents a flowchart 650 illustrating a method of a name resolution based on a hierarchical name, in accordance with an embodiment of the present application. During operation, a location management system receives a service request from a requesting device based on its current location (operation 652). The system determines the hierarchical domain name associated with the requested service and the location (operation 654) and checks whether a recursive lookup has been enabled (operation 656). If recursive lookup is not enabled, the system can perform a reverse name lookup using the hierarchical domain name for service and obtain associated service information (operation 658).

On the other hand, if recursive lookup is enabled, the system can determine a set of grid locations providing the service indicated by the hierarchical domain name based on a reverse name lookup (operation 660) and presents the set of grid locations to the requesting device (operation 662). The system then receives a location selection from the set of grid locations from the requesting device and obtains the service information associated with the selected location (operation 664). Upon obtaining service information (operation 658 or 664), the system provides the obtained service information to the requesting device (operation 666).

Exemplary Computer System and Apparatus

Figure 7:
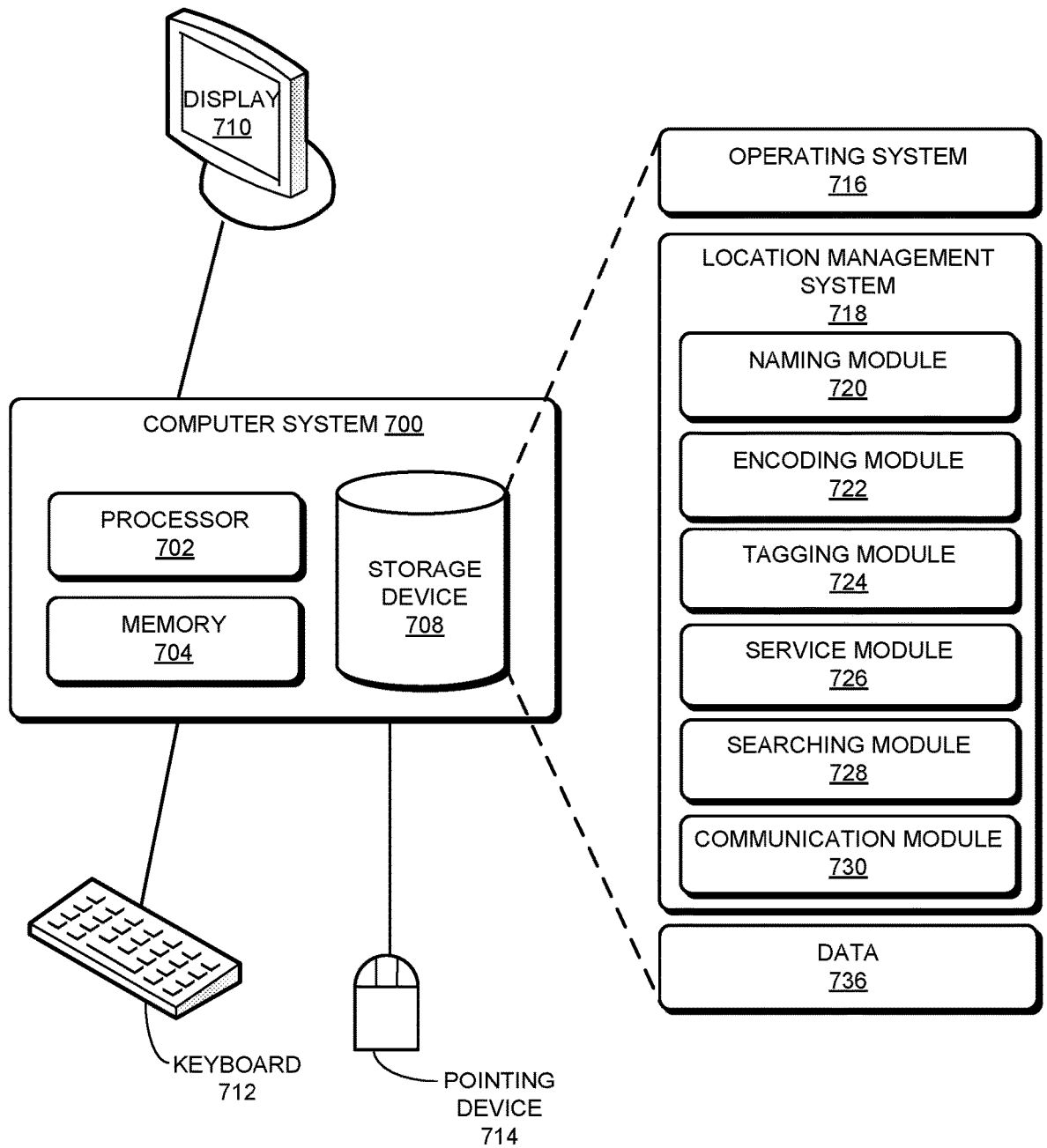
FIG. 7 illustrates an exemplary computer system that facilitates location-based service management using hierarchical names, in accordance with an embodiment of the present application.

FIG. 7 illustrates an exemplary computer system that facilitates location-based service management using hierarchical names, in accordance with an embodiment of the present application. Computer system 700 includes a processor 702, a memory device 704, and a storage device 708. Memory device 704 can include a volatile memory device (e.g., a dual in-line memory module (DIMM)). Furthermore, computer system 700 can be coupled to a display device 710, a keyboard 712, and a pointing device 714. Storage device 708 can store an operating system 716, a location management system 718, and data 736. Location management system 718 can facilitate the operations of one or more of: location management system 100, DNS server 104, and database server 106. Hence, computer system 700 may operate as any of server 102, DNS server 104, and database server 106.

Location management system 718 can include instructions, which when executed by computer system 700 can cause computer system 700 to perform methods and/or processes described in this disclosure. Specifically, location management system 718 can include instructions for determining a hierarchical name based on a recursively subdivided grid indicator of a geographic grid referencing system (naming module 720). Location management system 718 can also include instructions for encoding grid information, such as the GZD identifier, grid square information, and easting/northing digits, to represent the hierarchical name in a byte- or bit-oriented string (encoding module 722).

Furthermore, location management system 718 can also include instructions for incorporating a service tag and/or a domain with the hierarchical name to generate a hierarchical service and/or domain name, respectively (tagging module 724). In addition, location management system 718 includes instructions for storing service information in a service database and/or a DNS server in association with a hierarchical service and/or domain name, respectively (service module 726). Location management system 718 can also include instructions for performing recursive searches based on the hierarchical name (e.g., to obtain service information) (searching module 728).

Location management system 718 may further include instructions for sending and receiving messages (communication module 730). Data 736 can include any data that can facilitate the operations of location management system 718. Data 736 may include one or more of: geographic grid referencing information, encoded hierarchical names, service databases, and DNS records.

Figure 8:
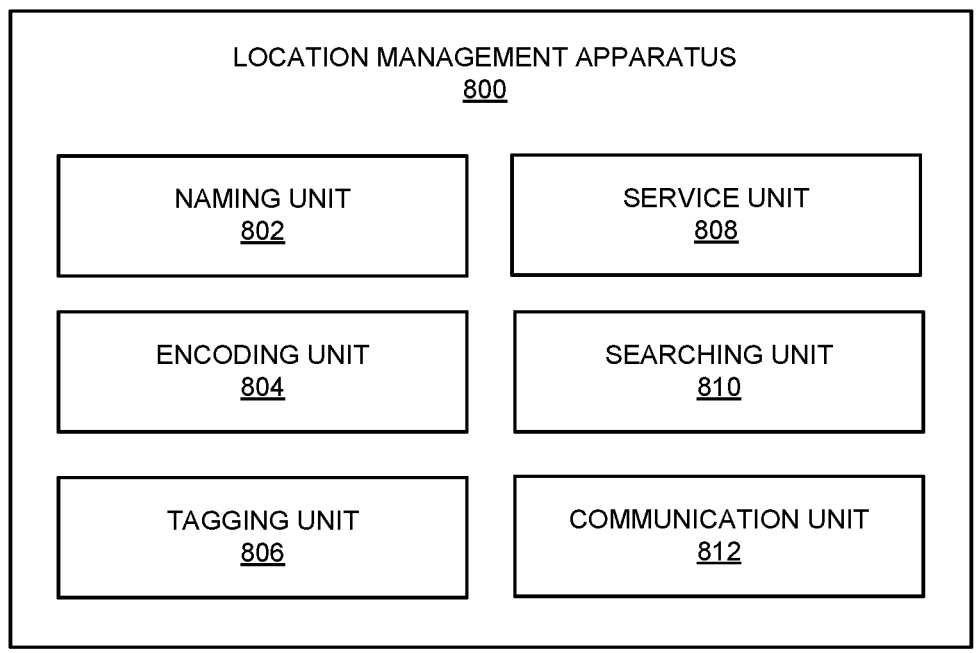
FIG. 8 illustrates an exemplary apparatus that facilitates location-based service management using hierarchical names, in accordance with an embodiment of the present application.

FIG. 8 illustrates an exemplary apparatus that facilitates location-based service management using hierarchical names, in accordance with an embodiment of the present application. Location management apparatus 800 can comprise a plurality of units or apparatuses which may communicate with one another via a wired, wireless, quantum light, or electrical communication channel. Apparatus 800 may be realized using one or more integrated circuits, and may include fewer or more units or apparatuses than those shown in FIG. 8. Further, apparatus 800 may be integrated in a computer system, or realized as a separate device that is capable of communicating with other computer systems and/or devices. Specifically, apparatus 800 can comprise units 802-812, which perform functions or operations similar to modules 720-730 of computer system 700 of FIG. 7, including: a naming unit 802; an encoding unit 804; a tagging unit 806; a service unit 808; a searching unit 810; and a communication unit 812.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disks, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A method for facilitating hierarchical geographic naming, comprising:
receiving a service request for a service in a network, wherein the service request comprises location information associated with a requesting device in the network;
determining a hierarchical name corresponding to the location information, wherein the hierarchical name encodes geographic grid referencing into a plurality of consecutive name segments of the hierarchical name, and wherein a respective name segment of the plurality of name segments corresponds to a recursively subdivided grid of the geographic grid referencing;

performing a recursive search using the hierarchical name for availability of the service requested by the service request;

determining, for a respective phase of the recursive search, whether the service is available in a location of the network represented by a grid associated with a name segment of the hierarchical name that corresponds to the phase; and in response to determining that the service is available in the grid, terminating the recursive search and sending a response comprising service information associated with the service to the requesting device.

2. The method of claim 1, wherein encoding the geographic grid referencing comprises encoding a portion of a representation of a respective dimension of the geographic grid referencing into the hierarchical name.

3. The method of claim 1, further comprising encoding the geographic grid referencing as a bit- or byte-oriented string and compressing the string using one of: arithmetic coding, Huffman coding, and a probability distribution.

4. The method of claim 1, wherein the geographic grid referencing is based on one of: Military Grid Reference System (MGRS) and Universal Transverse Mercator (UTM).

5. The method of claim 1, further comprising performing a longest-prefix match on the hierarchical name based on the encoded geographic grid referencing to forward a packet toward service provider providing the service.

6. The method of 1, further comprising:
maintaining a name resolution service (NRS) for geographic routing; and
obtaining information associated with the service provider from the NRS.

7. The method of claim 1, wherein the recursive search is one of:
a reverse domain name system (DNS) lookup performed using the hierarchical name; and
a database lookup performed using the hierarchical name.

8. The method of claim 1, wherein performing the recursive search comprises:
searching, in the geographic grid referencing, whether the requested service is available in a smallest grid indicated by the hierarchical name; and
in response to determining that the requested service is not available in the smallest grid, removing the name segment corresponding to the smallest grid and recursively performing the search in the geographic grid referencing based on the updated hierarchical name.

9. The method of claim 1, wherein, in response to determining that the service is available in the grid, the method further comprises:
retrieving the service information associated with the service from a service provider of the service.

10. The method of claim 1, further comprising incorporating in the hierarchical name one or more of:
a service tag indicating the requested service;
a high-level domain; and
a bit pattern distinguishing the hierarchical name from an identifier associated with the geographic grid referencing.

11. A non-transitory computer-readable storage medium storing instructions that when executed by a computer cause the computer to perform a method for facilitating hierarchical geographic naming, the method comprising:
receiving a service request for a service in a network, wherein the service request comprises location information associated with a requesting device in the network;

determining a hierarchical name corresponding to the location information, wherein the hierarchical name encodes geographic grid referencing into a plurality of consecutive name segments of the hierarchical name, and wherein a respective name segment of the plurality of name segments corresponds to a recursively subdivided grid of geographic grid referencing; and performing a recursive search using the hierarchical name for availability of the service requested by the service request;

determining, for a respective phase of the recursive search, whether the service is available in a location of the network represented by a grid associated with a name segment of the hierarchical name that corresponds to the phase; and in response to determining that the service is available in the grid, terminating the recursive search and sending a response comprising service information associated with the service to the requesting device.

12. The computer-readable storage medium of claim 11, wherein encoding the geographic grid referencing comprises encoding a portion of a representation of a respective dimension of the geographic grid referencing into the hierarchical name.

13. The computer-readable storage medium of claim 11, wherein the method further comprises encoding the geographic grid referencing as a bit- or byte-oriented string and compressing the string using one of: arithmetic coding, Huffman coding, and a probability distribution.

14. The computer-readable storage medium of claim 11, wherein the geographic grid referencing is based on one of: Military Grid Reference System (MGRS) and Universal Transverse Mercator (UTM).

15. The computer-readable storage medium of claim 11, wherein the method further comprises performing a longest-prefix match on the hierarchical name based on the encoded geographic grid referencing to forward a packet toward the service provider providing the service.

16. The computer-readable storage medium of claim 11, wherein the method further comprises:
maintaining a name resolution service (NRS) for geographic routing; and
obtaining information associated with the service provider from the NRS.

17. The computer-readable storage medium of claim 11, wherein the recursive search is one of:
a reverse domain name system (DNS) lookup performed using the hierarchical name; and
a database lookup performed using the hierarchical name.

18. The computer-readable storage medium of claim 11, wherein performing the recursive search comprises:
searching, in the geographic grid referencing, whether the requested service is available in a smallest grid indicated by the hierarchical name; and
in response to determining that the requested service is not available in the smallest grid, removing the name segment corresponding to the smallest grid and recursively performing the search in the geographic grid referencing based on the updated hierarchical name.

19. The computer-readable storage medium of claim 11, wherein, in response to determining that the service is available in the grid, the method further comprises:
   retrieving the service information associated with the service from a service provider of the service.

20. The computer-readable storage medium of claim 11, wherein the method further comprises incorporating in the hierarchical name one or more of:
   a service tag indicating the requested service;
   a high-level domain; and
   a bit pattern distinguishing the hierarchical name from an identifier associated with the geographic grid referencing.

* * * * *